(12) United States Patent
Bhardwaj (10) Patent No.: US 11,810,630 B2
(45) Date of Patent: Nov. 7, 2023

(54) MACHINE LEARNING ASSISTED READ VERIFY IN A MEMORY SUB-SYSTEM

(71) Applicant: Micron Technology, Inc., Boise, ID (US)

(72) Inventor: Amit Bhardwaj, Hyderabad (IN)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 17/523,523

(22) Filed: Nov. 10, 2021

(65) Prior Publication Data

US 2023/0061920 A1 Mar. 2, 2023

(30) Foreign Application Priority Data

Sep. 2, 2021 (IN) .............................. 202141039710

(51) Int. Cl.
| | |
|---|---|
| *G11C 16/16* | (2006.01) |
| *G11C 16/34* | (2006.01) |
| *G11C 16/10* | (2006.01) |
| *G06N 20/00* | (2019.01) |
| *G11C 29/18* | (2006.01) |
| *G11C 16/26* | (2006.01) |
| *G06F 18/21* | (2023.01) |
| *G06F 18/243* | (2023.01) |

(52) U.S. Cl.
CPC ...... *G11C 16/3495* (2013.01); *G06F 18/2178* (2023.01); *G06F 18/24323* (2023.01); *G06N 20/00* (2019.01); *G11C 16/102* (2013.01); *G11C 16/16* (2013.01); *G11C 16/26* (2013.01); *G11C 29/18* (2013.01)

(58) Field of Classification Search
CPC ... G11C 16/3495; G11C 16/102; G11C 16/16; G11C 16/26; G11C 29/18; G11C 29/028; G11C 16/349; G06F 18/2178; G06F 18/24323; G06N 20/00
See application file for complete search history.

(56) References Cited

U.S. PATENT DOCUMENTS

2020/0082890 A1* 3/2020 Karr ..................... G06F 3/0688

* cited by examiner

*Primary Examiner* — Xiaochun L Chen
(74) *Attorney, Agent, or Firm* — Lowenstein Sandler LLP (57) ABSTRACT

An on-chip copy command is detected. The on-chip copy command comprises a source address referencing a plane of a memory device, and a destination address referencing the plane. A read verify relevance is estimated by processing, by a machine learning mode, one or more parameters associated with data stored at the source address. Responsive to determining that the read verify relevance satisfies a threshold condition, the on-chip copy command is performed.

20 Claims, 5 Drawing Sheets

Generate training data for a machine learning model, wherein generating the training data comprises: 410

Identify first training input having data characteristics comprising one or more input parameter values describing data stored at an address. 420

Perform a read verify operation on a portion of the data stored at the address. 430

Identify a first target output for the first training input, wherein the first target output comprises an outcome of the read verify operation. 440

Provide the training data to train a machine learning model on a set of training inputs comprising the first training input and a set of training outputs comprising the first training output. 450

MACHINE LEARNING ASSISTED READ VERIFY IN A MEMORY SUB-SYSTEM

REFERENCE TO RELATED APPLICATIONS

The present application claims the benefit of priority under 35 U.S.C. § 119 to Indian Patent Application No. 202141039710 filed on Sep. 2, 2021, the disclosure of which is incorporated by reference herein.

TECHNICAL FIELD

Embodiments of the disclosure relate generally to memory sub-systems, and more specifically, relate to machine learning assisted read verify in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to machine learning assisted read verify in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

The memory sub-system can include multiple memory devices that can store data from the host system. Each memory device can include a different type of media. Examples of media include, but are not limited to, a cross-point array of non-volatile memory and flash-based memory such as single-level cell (SLC) memory, triple-level cell (TLC) memory, and quad-level cell (QLC) memory. Different types of media can have different data density. Data density corresponds to an amount of data (e.g., bits of data) that can be stored per memory cell of a memory device. Using the example of a flash based memory, a quad-level cell (QLC) can store four bits of data while a single-level cell (SLC) can store one bit of data. Accordingly, a memory device including QLC memory cells will have a higher data density than a memory device including SLC memory cells.

Some memory sub-systems use SLC as a cache, and migrate data from the SLC cache to other memory, such as MLC memory, TLC memory, QLC memory, etc., for longer-term storage. For example, data can be migrated from SLC cache to other memory (e.g., QLC) once the data stored at the SLC cache has reached a capacity threshold. A memory sub-system controller can migrate data from SLC cache in response to receiving data from a host system. The data can be migrated using an on-chip copyback operation. An on-chip copyback operation is one in which the controller migrates data from a source address referencing SLC and a destination address referencing QLC using the memory device latches. That is, in performing an on-chip copyback operation, the controller senses the data to be migrated into the memory device latch, and then programs it directly to the destination address in the memory device. The data to be migrated is not read by the controller, and does not pass through an error correction engine prior to being written. An on-chip copyback operation allows for data to be read and written within the same memory device plane without the use of a cache register or consuming the bus for data transfer. However, because the data moved using a copyback operation does not pass through an error correction engine prior to being written to the destination QLC, copyback operations can lead to the propagation of errors from the data stored in the SLC to the data stored in the QLC. That is, since the data is moved on-chip using latches, the data is not being corrected before it is moved from SLC to QLC in a copyback operation. Hence, errors within the data are propagated when the data is moved from SLC to QLC.

To avoid error propagation, memory sub-systems can employ a read verify operation. A read verify operation is performed by initiating a read of a portion of the copyback data on the memory device. In embodiments, the memory device can perform the read on the portion of the copyback data, determine a number of errors in the portion read, and notify the memory sub-system controller of the same. The memory sub-system controller can determine whether the number of errors satisfies a read verify threshold criterion (e.g., meets or exceeds a read verify threshold number), and if so, can perform an off-chip copy command (i.e., can read the entire data to be moved, execute an error correction procedure on the data, and then write the corrected data to the destination address). If the number of errors does not satisfy the read verify threshold criterion (i.e., is below a read verify threshold number), the memory sub-system controller can execute the on-chip copyback command. Performing a read verify for every on-chip copyback command consumes resources (e.g., bus bandwidth) and can negatively affect performance of the memory sub-system.

Aspects of the present disclosure address the above and other deficiencies by using a machine learning model that can predict whether a read verify operation is needed for a particular on-chip copyback command. An on-chip copyback command is one in which the controller migrates data from a source address referencing SLC and a destination address referencing QLC using the memory device latches. The machine learning model can be created and trained, for example, at the manufacturing of the memory device, or during memory characterization. Furthermore, the model can be trained, retrained, and/or validated during operation of the memory device. The model can predict the relevance of a read verify operation to avoiding propagating errors associated with the data to be migrated. The model can be a supervised machine learning model that uses labeled data as input. The input data can include data characteristic parameters and parameters describing the source address of the data to be migrated, including the program erase count, the block number, the wordline number, the elapsed time since the last write, and the device temperature. The input data can be mapped to target output data. Based on these input parameters, the model can be trained to determine whether a read verify operation is needed for the data associated with a particular copyback operation. The output of the machine learning model can be a probability that a read verify operation is needed on the particular copyback data.

The machine learning model can be retrained with input data obtained during operation of the memory device on which it is running. In embodiments, the memory sub-system controller can perform a read verify for each copyback operation until the machine learning model has reached a predefined confidence level. That is, if the machine learning model predicts that a read verify is needed but the error rate associated with the copyback data is below the read verify threshold number (i.e., indicating that a read verify is not necessary), the memory sub-system controller can continue to train the machine learning model with data generated on the memory device. Similarly, if the machine learning model predicts that a read verify is not needed but the error rate associated with the copyback data is above the read verify threshold number (i.e., indicating that a read verify is necessary), the memory sub-system controller can continue to train the machine learning model with data generated on the memory device.

Once the machine learning model's predictions reach a certain confidence level, the memory sub-system controller can stop training the model and start relying on the model's predictions. For example, if the model predicts that a read verify is not needed, and the error rate satisfies a threshold criterion (e.g., is 40% below the error rate for which a read verify is not needed), then the memory sub-system controller can determine to stop training and start using the model. Using the machine learning model, the memory sub-system controller can detect a copyback operation. The memory sub-system can identify the source SLC address of the copyback operations, and provide the parameters of the source SLC address as input to the machine learning model. The memory sub-system controller can then determine whether to perform a read verify operation on the data to be migrated based on the output of the machine learning model.

The memory sub-system controller can periodically check the accuracy of the machine learning model and, based on the accuracy checks, can determine to disable the model and retrain the model using operational memory device data. Once the model reaches the confidence level, the memory sub-system controller can enable the model. Additionally, the memory sub-system controller can disable the machine learning model, for example, based on the lifecycle of a memory device. A memory device that is approaching the end of its lifecycle can be more prone to errors, and hence each copyback operation may require a read verify operation. In such cases, the memory sub-system controller can disable the model to avoid running the model unnecessarily.

Advantages of the present disclosure include, but are not limited to, minimizing error propagation, and improving performance and quality of service (QoS) associated with copyback operations by triggering read verify operations only when they are needed. That is, advantages of the present disclosure include only performing read verify operations when the output of the machine learning model indicates that a read verify operation is needed to avoid error propagation. This results in better performance and QoS due to faster data migration from SLC to QLC blocks.

Figure 1:
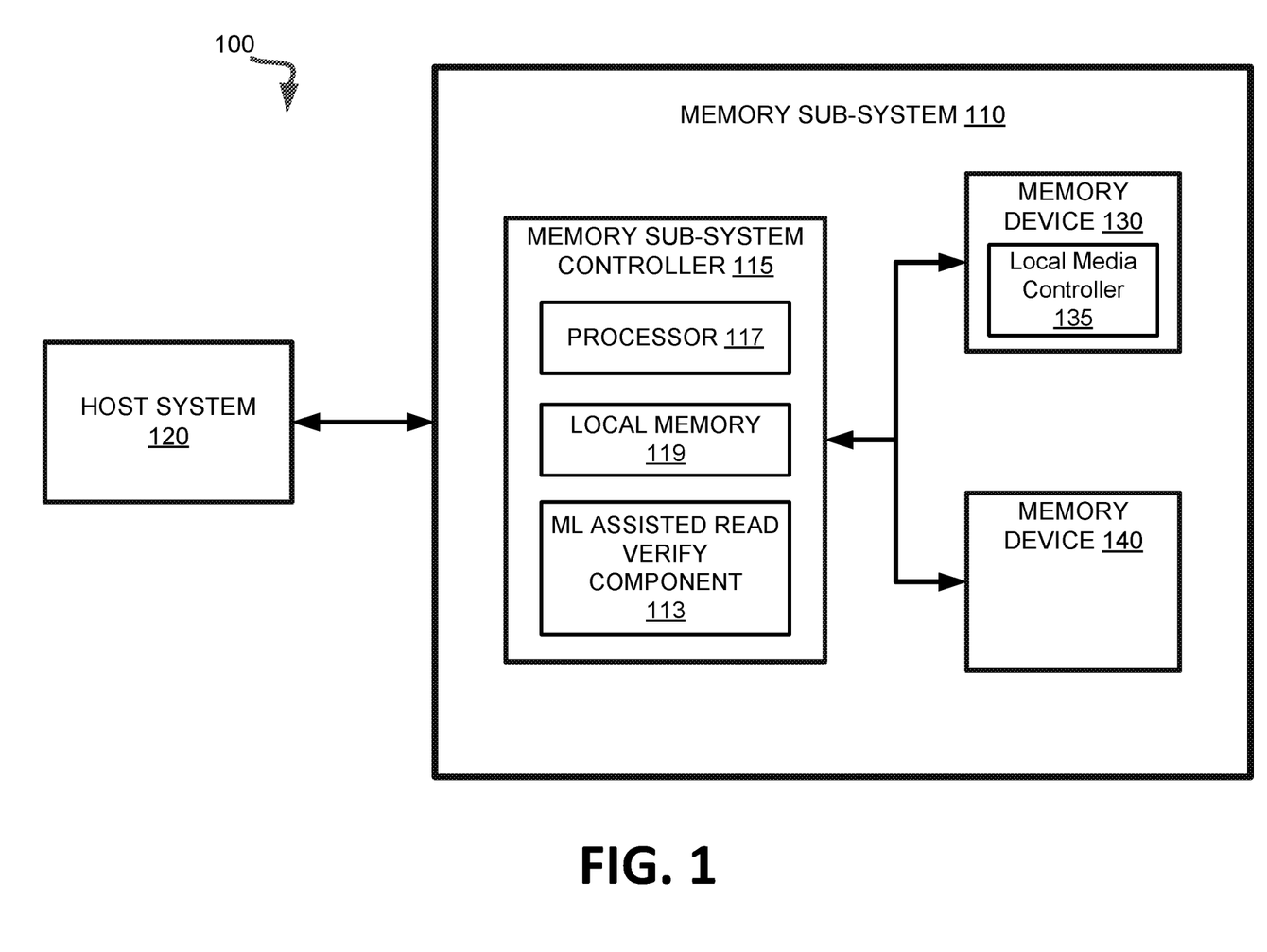
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO- DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a machine learning (ML) assisted read verify component 113 that can train and use a machine learning model to determine to perform a read verify operation for an on-chip copyback operation to avoid error propagation. In some embodiments, the memory sub-system controller 115 includes at least a portion of the ML assisted read verify component 113. In some embodiments, the ML assisted read verify component 113 is part of the host system 110, an application, or an operating system. In other embodiments, local media controller 135 includes at least a portion of ML assisted read verify component 113 and is configured to perform the functionality described herein.

The ML assisted read verify component 113 can train, retrain, validate, and use a machine learning model to determine whether to perform a read verify operation for an on-chip copyback operation to avoid propagating erroneous data. The ML assisted read verify component 113 can detect an on-chip copyback command, and identify the source address from which data is to be migrated. The ML assisted read verify component 113 can process, by a machine learning model, the input parameters describing the source address. The machine learning model can estimate a read verify relevance, i.e., whether a read verify operation is needed on the on-chip copyback data to avoid propagating errors from the source to the destination address. Hence, the ML assisted read verify component 113 can receive the output of the machine learning model and determine whether the read verify relevance satisfies a threshold condition (e.g., whether the read verify relevance is below a read verify threshold value, thus indicating that a ready verify operation is not needed on the copyback data to avoid error propagation). If the ready verify relevance satisfies the threshold condition, the ML assisted read verify component 113 can cause the on-chip copyback command to be performed.

However, if the read verify relevance does not satisfy the threshold condition, the ML assisted read verify component 113 can perform a read verify operation prior to determining whether to execute the on-chip copyback operation. In some embodiments, the ML assisted read verify component 113 can perform a read verify operation on a portion of the copyback data. For example, the copyback data can reference a plane, and the read verify operation can be perform on a codeword of the plane. The ML assisted read verify component 113 can read the portion of the copyback data and determine a number of errors in the portion read. For example, the ML assisted read verify component 113 can determine the raw bit error rate (RBER) of the portion read. In storing data, a memory device can produce bit errors associated with erroneous or corrupted bits, which can be correctable by employing error-correcting code (ECC). The RBER corresponds to a number of bit errors per portion (e.g., per page or per code word) that the data stored at the data block experiences. If the RBER indicates a high error rate associated with data stored at the data block, then the ML assisted read verify component 113 can correct the errors prior to migrating the data to the destination address. The ML assisted read verify component 113 can perform a read recovery procedure to correct the data. The read recovery procedure can include reading the data from the memory device plane referenced by the source address and performing error correction (e.g., by employing ECC) before writing the data to the destination address. However, if the number of bit errors in the portion read is low (e.g., the RBER is below the predetermined value), the ML assisted read verify component 113 can perform the copyback command.

In some embodiments, the machine learning model can be trained at the manufacturing of the memory device or during memory characterization. The machine learning model can be trained prior to the memory sub-system being deployed, and can be trained using a training labeled data set during memory the characterization process. The machine learning model can be trained using a supervised algorithm, such as a random forest algorithm.

In some embodiments, the ML assisted read verify component 113 can enable and disable the machine learning model. The ML assisted read verify component 113 can initially disable the machine learning model and continue training the model using data generated during operation of the memory sub-system. When the model is disabled, the ML assisted read verify component 113 perform a read verify operation for every on-chip copyback command, and can use the parameters associated with each read verify to determine whether to enable the model. The ML assisted read verify component 113 can then enable the model once it has reached a certain confidence level.

More specifically, while continuing to train the model, the ML assisted read verify component 113 can compare the output of the model to a threshold confidence level to determine whether to enable the model. For example, if the read verify relevance estimated by the model is below a read verify threshold value (i.e., the model predicts that a read verify not needed), but the RBER of the portion of data read during the read verify equals or exceeds a RBER threshold value, the ML assisted read verify component 113 can determine to continue retraining the model using data generated during operation of the memory device. If the read verify relevance estimated by the model is equal to or above a read verify threshold value (i.e., the model predicts that a read verify is needed), but the RBER of the portion of data read during the read verify is less than the RBER threshold value, the ML assisted read verify component 113 can determine to continue retraining the model using data generated during operation of the memory device. However, once the read verify relevance estimated by the model is below a read verify threshold value (i.e., the model predicts that a read verify not needed), and the RBER of the portion of data read during the read verify is less than the RBER threshold value, the ML assisted read verify component 113 can determine to stop training the model and can enable the model. In some embodiments, the ML assisted read verify component 113 can enable the model once the output of the model is below the read verify threshold value and the RBER is much below (e.g., 30%, or 40% below) the RBER threshold value. Once the model is enabled, each copyback operation detected will first pass through the model to determine whether a read verify is to be executed prior to perform the copyback operation.

The ML assisted read verify component 113 can recheck the confidence level periodically, and can disable the model if the confidence level falls below a threshold value. Furthermore, the ML assisted read verify component 113 can disable the use of the model for certain memory devices that have reached a certain point in their lifecycles. For example, a certain number of program erase cycles performed on a memory device can cause the memory device to degrade, which can increase the errors within the memory device. The ML assisted read verify component 113 can determine that after a certain number of program erase cycles associated with a particular memory device, a read verify operation is likely to be necessary for every on-chip copyback operation. As such, the ML assisted read verify component 113 can disable the model to avoid performing an extra step for each on-chip copyback operation.

Further details with regards to the operations of the ML assisted read verify component 113 are described below.

Figure 2:
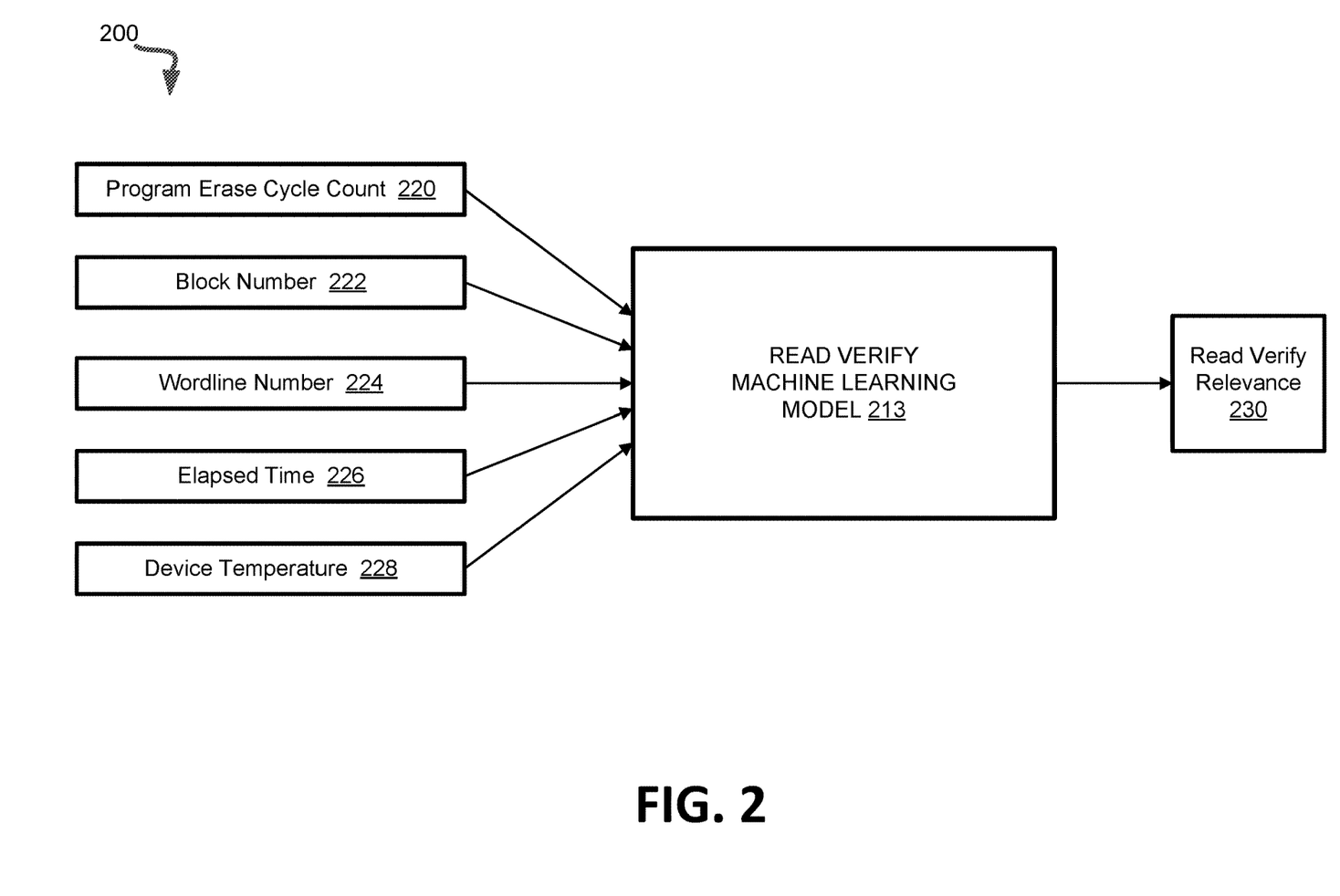
FIG. 2 illustrates an example system architecture for training a read verify machine learning model, in accordance with some embodiments of the present disclosure.

FIG. 2 illustrates an example of a system architecture 200 for training a read verify machine learning model, in accordance with some embodiments of the present disclosure. The system 200 can be included in the ML assisted read verify component 113 of FIG. 1. The system 200 can include a read verify machine learning model 213.

In embodiments, the read verify machine learning model 213 can be trained during manufacturing and/or characterization of the memory device. The read verify machine learning model 213 can be trained using labeled training data from a database of training data. The training data can include sets of training input mapped to target outputs. Each set of training inputs can include a program erase cycle count 220, a block number 222, a wordline number 224, an elapsed time 226, and/or a device temperature 228. The target output can be an estimate of a read verify relevance 230, which can indicate whether a read verify is needed to avoid propagating errors in the data associated with the input parameters. For example, the output of the machine model can be a value between 0 and 1, with 0 indicating that a read verify operation is not needed and 1 indicating that a read verify is needed to avoid error propagation.

In embodiments, the labeled training data can be generated during characterization of the memory device. The characterization process can include performing a program erase read cycle of entire memory devices. During the program erase read cycle of a memory device, the input parameters can be determined and stored for each plane of the memory device. Additionally, the program erase read cycle can include determining, for each set of input parameters, whether a read verify operation is needed to avoid propagating errors in the data associated with set of input parameters. To determine whether a read verify operation is needed, the system can read a portion of the plane and determine the RBER corresponding to the portion of data read. For example, the RBER for a given wordline can be obtained by determining a maximum RBER from a set of sample memory cells on the given wordline. If the RBER is above a certain predetermine value, then a read verify operation is needed to avoid error propagation. The system can map the input parameters with a target output indicating that a read verify operation is needed.

In embodiments, the read verify machine learning model 213 can be trained, retrained, and/or validated during operation of the memory sub-system. In such case, the ML assisted read verify component 113 of FIG. 1 can detect an on-chip copyback operation. The on-chip copyback operation can instruct the ML assisted read verify component 113 to migrate data from a source SLC address to a destination QLC address. The ML assisted read verify component 113 can identify the input parameters and provide them as input to the read verify machine learning model 213. The read verify machine learning model 213 can receive as input parameters a program erase cycle count 220 associated with the source address, a block number 222 referenced by the source address, a wordline number 224 referenced by the source address, an elapsed time 226 associated with the source address, and a device temperature 228 of the memory device. In embodiments, these parameter values can be determined and/or maintained by memory devices 130-140 of FIG. 1. The parameter values 222-228 can describe the state of the memory device at the source address referenced by a copyback operation. That is, the program erase cycle count 220 can identify the number of program erase cycles performed at the source address of the memory device. The block number 222 and the wordline number 224 can identify the block number associated with the source address of the memory device. The elapsed time 226 can identify the time elapsed since the last write operation was performed at the source address. The device temperature 228 can be the temperature of the memory device. The memory device can have a thermal sensor connected to it, and the memory device can send a temperature reading to the memory sub-system controller. In embodiments, the memory sub-system controller can access the thermal sensor and determine the temperature of the memory device directly.

The ML assisted read verify component 113 can perform a read verify operation on the data stored at the source address referenced by the on-chip copyback operation. The read verify machine learning model 213 can determine the target output for the set of input parameters 220-228 based on the outcome of the read verify operation. The read verify machine learning model 213 can then map the target output to the set of input parameters, and provide it to the read verify machine learning model 213 as additional training data.

The read verify machine learning model 213 can be trained using a random forest algorithm. A random forest algorithm builds a number of decisions trees from the sets of input training data and determines the output based on the an average of the outcome of each decision tree. Once the read verify machine learning model 213 has reached a certain confidence level, the ML assisted read verify component 113 can enable the use of the read verify machine learning model 213 within the memory sub-system controller 115. The ML assisted read verify component 113 can determine that the read verify machine learning model 213 has reached the required confidence level when the read verify machine learning model 213 consistently predicts that a read verify operation is not needed for sets of input parameters, and the RBER associated with the sets of input parameters is below a threshold value (e.g., 30% or 40% below the RBER bit error threshold value used to determine whether to perform a read verify operation). The ML assisted read verify component 113 can disable the use of the read verify machine learning model 213 when a memory device has reached a predetermined stage in its lifecycle (e.g., indicated by having a threshold number of program erase cycles). Additionally, the ML assisted read verify component 113 can periodically validate the read verify machine learning model 213 and can disable and retrain the model if the confidence level is no longer satisfied.

Figure 3:
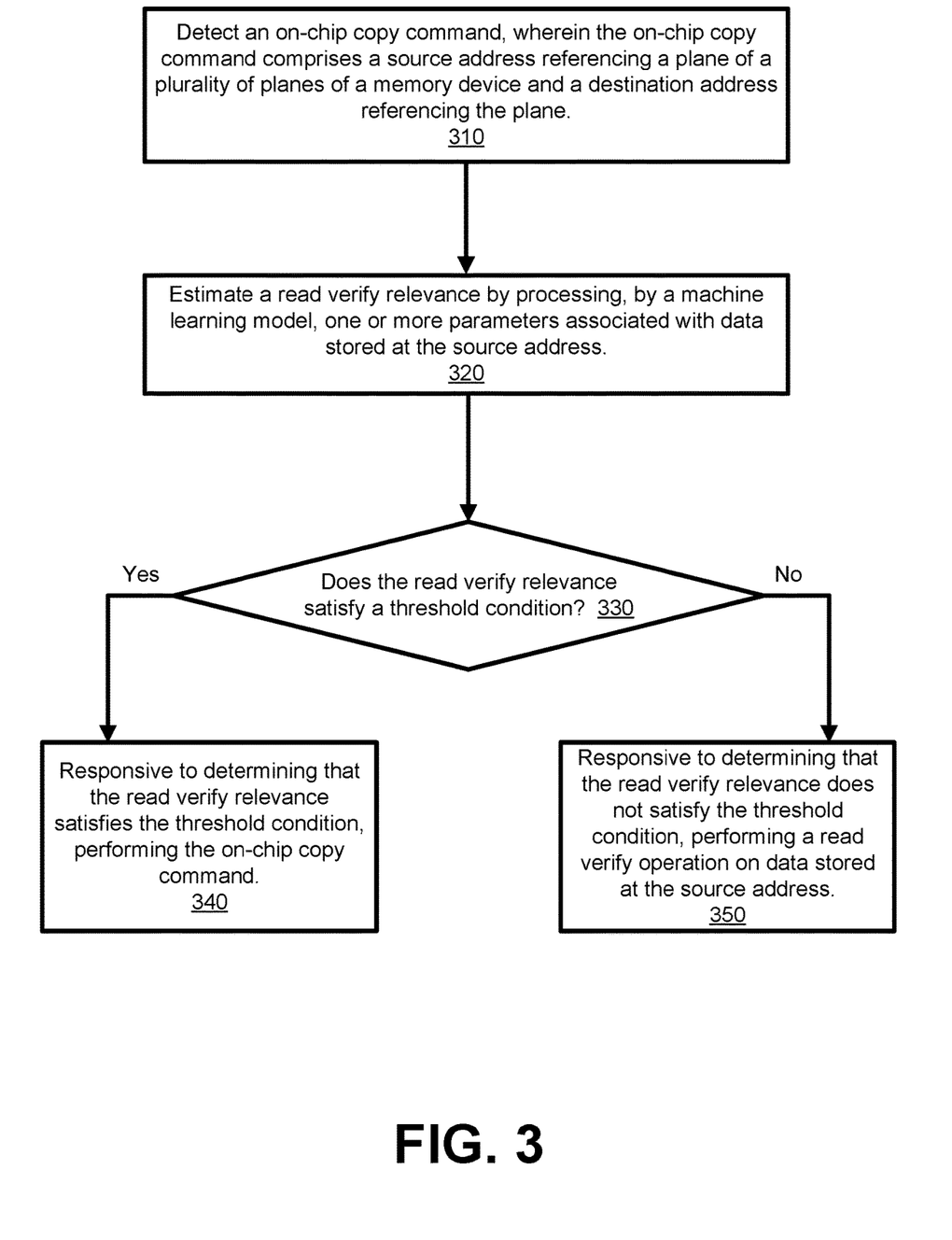
FIG. 3 is a flow diagram of an example method to use a machine learning model to determine whether to perform a read verify operation, in accordance with some embodiments of the present disclosure.

FIG. 3 is a flow diagram of an example method 300 to use a machine learning model to determine whether to perform a read verify operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the ML assisted read verify component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic detects on an-chip copy command (i.e., a copyback command). The on-chip copy command can include a source address referencing a plane of a plurality of planes within a memory device, and a destination address referencing the plane. The on-chip command can instruct the processing logic to migrate data stored at the source address to the destination address.

At operation 320, the processing logic estimates a read verify relevance by processing, by a machine learning model, one or more parameters associated with data stored at the source address. The read verify relevance can predict whether a read verify operation is needed to avoid propagating errors associated with the data stored at the source address. The one or more parameters can include at least one of a program erase count associated with the source address, a wordline associated with the source address, a block number associated with the source address, an elapsed time since the source address was last written to, and a temperature of the memory device. In embodiments, a thermal sensor can be attached to (or built-in) the memory device, and the memory device can send to the processing logic a temperature reading from the thermal sensor periodically (e.g., every 1 minute) or on-demand (e.g., responsive to a request to provide a temperature reading). In embodiments, the processing logic can access the thermal sensor and can determine the temperature reading for the memory device directly. In some embodiments, the memory device maintains the program erase count and the elapsed time values, and can send them to processing logic. The wordline and the block number can be determined based on the source address referenced by the on-chip copy command.

In embodiments, the machine learning model is a supervised machine learning model, and is trained using a random forest algorithm. The machine learning model can be trained at manufacturing and/or during characterization of the memory device.

At operation 330, the processing logic determines whether the read verify relevance satisfies a threshold condition. The threshold condition can be a satisfied if the read verify relevance is below a read verify threshold value, thus indicating that a read verify operation is not needed on the data stored at the source address to avoid error propagation. That is, the read verify relevance can indicate that the outcome of a read verify operation (i.e., the RBER determined by the read verify operation), if it were performed, would probabilistically be below the RBER threshold value.

At operation 340, responsive to determining that the read verify relevance satisfies the threshold condition, the processing logic performs the on-chip copy command. In some embodiments, the processing logic can determine a bit error rate for a portion of the data stored at the source address. The processing logic can use the bit error rate to validate the machine learning model. That is, the processing logic can compare the bit error rate to a bit error rate threshold to determine whether a read verify operation should have been performed. Responsive to determining that the bit error rate is above or equal to a bit error rate threshold and determining that the read verify relevance satisfies the threshold condition, the processing logic can disable the machine learning model. That is, if the bit error rate is above or equal to the bit error rate threshold, the read verify relevance obtained the machine learning model should have not satisfied the threshold condition. Hence, the machine learning model is not validated and the processing logic can disable the model. The processing logic can retrain the machine learning model using input data generated during operation of the memory device. For example, the processing logic can use the input parameters from this on-chip copy command and the bit error rate as a labeled input-output training data set to retrain the machine learning model.

In some embodiments, the processing logic can determine to enable the machine learning model responsive to determining that the bit error rate is a predetermined amount below the bit error rate threshold and that the read verify relevance satisfies the threshold condition. In embodiments, the predetermined amount can be a percentage, for example 30% or 40%. Hence, in an example, the processing logic can determine to enable the model when the outcome of the model predicts that a read verify is not needed to avoid error propagation, and the bit error rate associated with a read verify operation performed on the data stored at the source address is 30% below the bit error rate threshold. Enabling the machine model can mean stopping (or pausing) the training the model and starting to rely on the outcomes of the machine learning model in determining whether to perform an on-chip copy command.

At operation 350, responsive to determining that the read verify relevance does not satisfy the threshold condition, the processing logic performs a read verify operation on data stored at the source address. That is, the read verify relevance is above or equal to a read verify threshold value, thus indicating that a read verify operation is needed on the data stored at the source address to avoid error propagation. In order to perform a read verify operation, the processing logic reads a portion of the data stored at the source address. For example, the processing logic can read a codeword of the plane referenced by the source address. The processing logic determines a bit error rate (e.g., RBER) for the portion of the data. Responsive to determining that the bit error rate is below a bit error rate threshold, the processing logic performs the on-chip copy command. However, responsive to determining that the bit error rate is above or equal to the bit error rate threshold, the processing logic performs an off-chip copy command. The off-chip copy command can include an error recovery procedure. The off-chip copy command can include reading the data, correcting the errors in the read data (e.g., using error detection and correction operation), and write the corrected data at the destination address. In some embodiments, the processing logic can perform a RAIN recovery procedure to correct the errors.

In some embodiments, responsive to determining that the program erase count associated with the source address satisfied a program erase count condition, the processing logic disables the machine learning model. The program erase count condition can be satisfied when the program erase count is equal to or exceeds a predetermined program erase count value. A high program erase count value can indicate that the memory device (or at least the portion of the memory referenced by the source address) has been programmed and erased a relatively large number of times. After a certain number of program erase cycles, the memory device can be more prone to errors. Hence, the processing logic can determine that a read verify operation is needed for every source address that has a program erase count satisfying the program erase count condition. To save on resources, rather running the machine learning model on input parameters that include a high program erase count, the processing logic can disable the trained model and perform a read verify operation for each detected on-chip copy command.

Figure 4:
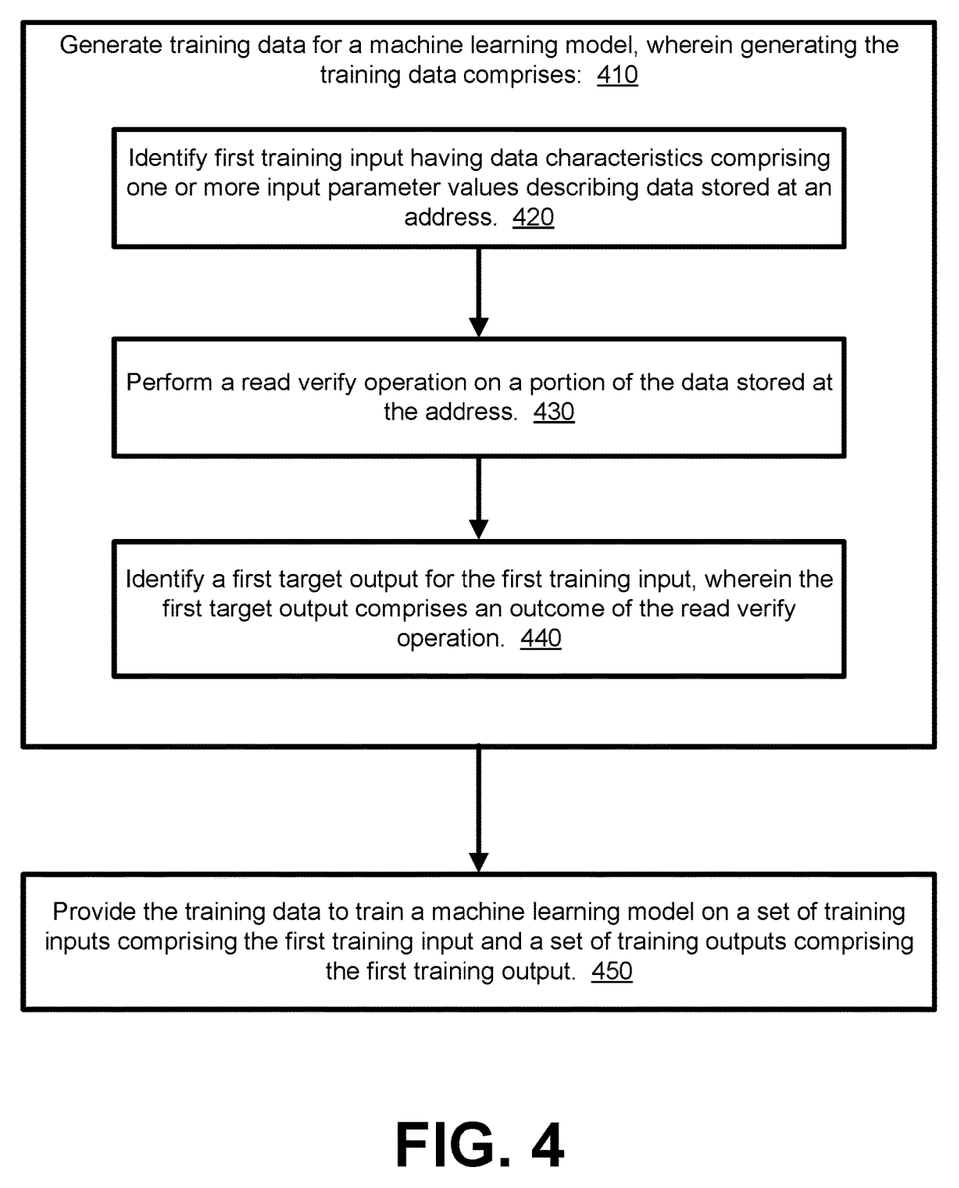
FIG. 4 is a flow diagram of an example method to train a machine learning model to determine whether to perform a read verify operation, in accordance with some embodiments of the present disclosure.

FIG. 4 is a flow diagram of an example method 400 to train a machine learning model to determine whether to perform a read verify operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the ML assisted read verify component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic generates training data for a machine learning model. Generating the training data includes operations 420-440 below. The processing logic can generate the training data during manufacturing of the memory device and/or during characterization of the memory device. The characterization process can include perform a program, read, and erase cycle for the entire memory device, during which certain characteristics of the memory device can be identified and used to generate training data for the machine learning model.

At operation 420, the processing logic identifies first training input having data characteristics comprising one or more input parameter values describing data stored at an address. The address can be a physical address referencing a data storage location within the memory device. The one or more parameter input parameter values can include at least one of a program erase count associated with the address, a wordline associated with the address, a block number associated with the address, an elapsed time since the address was last written to, and a temperature of the memory device.

At operation 430, the processing logic performs a read verify operation on a portion of the data stored at the address. Performing the read verify operation can include reading the portion of the data and determining a bit error rate for the portion of the data.

At operation 440, the processing logic identifies a first target output for the first training input, wherein the first target output comprises an outcome of the read verify operation. The outcome of the read verify operation can be the bit error rate for the portion of the data.

At operation 450, the processing logic provides the training data to train a machine learning model on a set of training inputs comprising the first training input and a set of training outputs comprising the first training output. Each training input in the set of training inputs is mapped to a respective target output in the set of target outputs. In embodiments, the processing logic can train the machine learning model using a random forest approach. The random forest approach can include multiple decision trees that each evaluate the input parameters to predict the outcome of a read verify operation.

Figure 5:
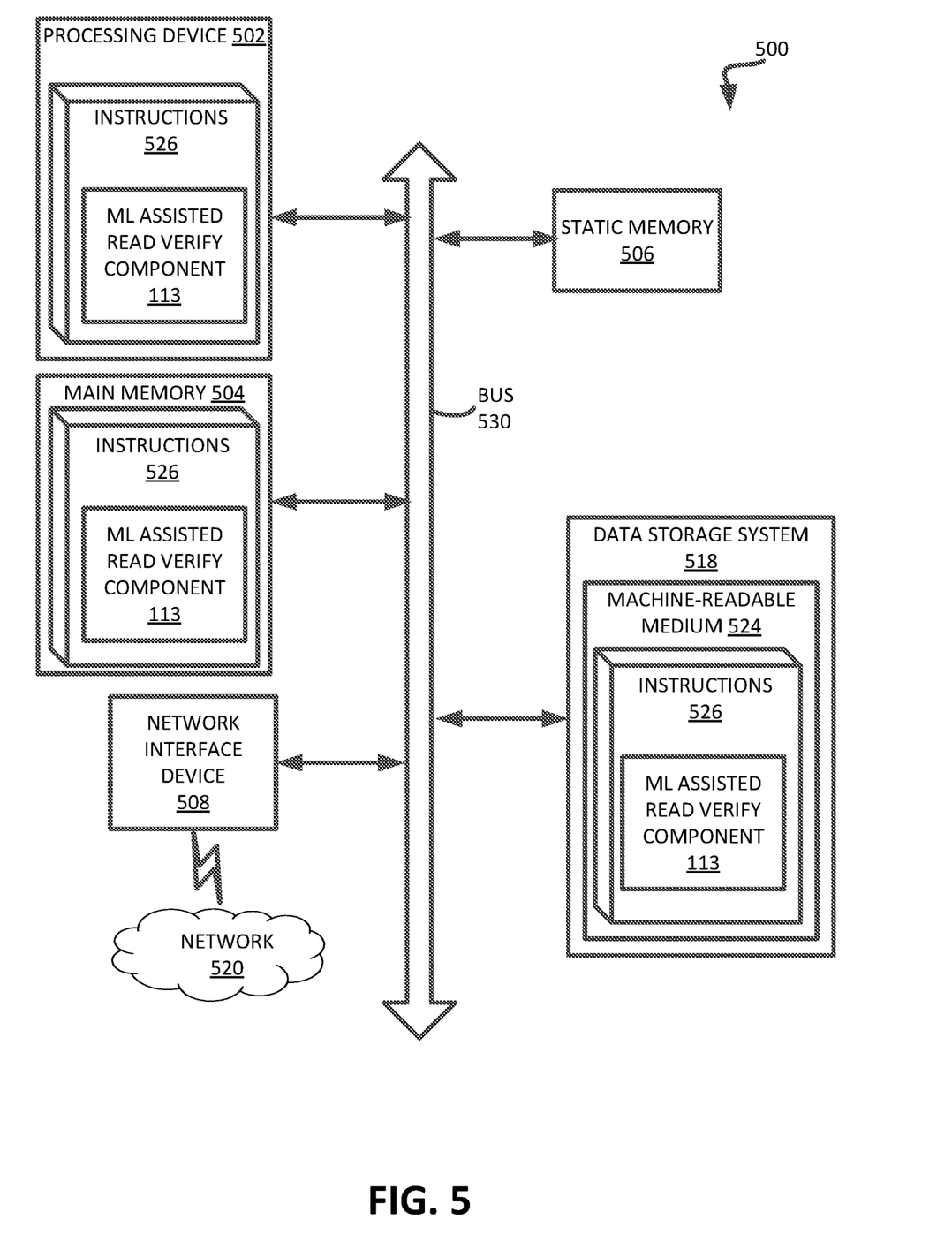
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the ML assisted read verify component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an ML assisted read verify component (e.g., the ML assisted read verify component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of planes; and
a processing device, operatively coupled with the of memory device, to perform operations comprising:
detecting an on-chip copy command, wherein the on-chip copy command comprises a source address referencing a plane of the plurality of planes and a destination address referencing the plane;
estimating a read verify relevance by processing, by a machine learning model, one or more parameters associated with data stored at the source address; and
responsive to determining that the read verify relevance satisfies a threshold condition, performing the on-chip copy command.

2. The system of claim 1, wherein the machine learning model is a supervised machine learning model.

3. The system of claim 1, wherein the machine learning model is trained using a random forest algorithm.

4. The system of claim 1, wherein the one or more parameters comprise at least one of: a program erase count associated with the source address, a wordline associated with the source address, a block number associated with the source address, an elapsed time since the source address was last written to, and a temperature of the memory device.

5. The system of claim 1, wherein the operations further comprise:
responsive to determining that the read verify relevance does not satisfy the threshold condition, performing a read verify operation on the data stored at the source address.

6. The system of claim 5, wherein the operations further comprise:
reading a portion of the data stored at the source address;
determining a bit error rate for the portion of the data;
responsive to determining that the bit error rate is below a bit error rate threshold, performing the on-chip copy command; and
responsive to determining that the bit error rate is above or equal to the bit error rate threshold, performing an off-chip copy command, wherein the off-chip copy command comprises an error recovery procedure.

7. The system of claim 1, wherein the operations further comprise:
determining a bit error rate for a portion of the data stored at the source address;
responsive to determining that the bit error rate is above or equal to a bit error rate threshold and that the read verify relevance satisfies the threshold condition, disabling the machine learning model; and
retraining the machine learning model using input data generated during operation of the memory device.

8. The system of claim 7, wherein the operations further comprise:
responsive to determining that the bit error rate is a predetermined amount below the bit error rate threshold and that the read verify relevance satisfies the threshold condition, enabling the machine learning model.

9. The system of claim 1, wherein the operations further comprise:
responsive to determining that a program erase count associated with the source address satisfies a program erase count condition, disabling the machine learning model.

10. A method comprising:
generating training data for a machine learning model, wherein generating the training data comprises:
identifying a first training input having data characteristics comprising one or more input parameter values describing data stored at an address;
performing a read verify operation on a portion of the data stored at the address; and
identifying a first target output for the first training input, wherein the first target output comprises an outcome of the read verify operation; and
providing the training data to train a machine learning model on a set of training inputs comprising the first training input and a set of target outputs comprising the first target output.

11. The method of claim 10, wherein the one or more input parameter values comprise at least one of: a program erase count associated with the address, a wordline associated with the address, a block number associated with the address, an elapsed time since the address was last written to, and a temperature of a memory device referenced by the address.

12. The method of claim 10, wherein performing the read verify operation comprises:
reading the portion of the data stored at the address;
determining a bit error rate for the portion of the data; and
wherein the outcome of the read verify operation comprises the bit error rate for the portion of the data.

13. The method of claim 10, wherein each training input in the set of training inputs is mapped to a respective target output in the set of target outputs.

14. The method of claim 10, wherein the machine learning model is trained using a random forest algorithm.

15. A non-transitory computer-readable storage medium comprising instructions that, when executed by a processing device, cause the processing device to perform operations comprising:
detecting an on-chip copy command, wherein the on-chip copy command comprises a source address referencing a plane of a memory device and a destination address referencing the plane;
estimating a read verify relevance by processing, by a machine learning model, one or more parameters associated with data stored at the source address; and
responsive to determining that the read verify relevance satisfies a threshold condition, performing the on-chip copy command.

16. The non-transitory computer-readable storage medium of claim 15, wherein the machine learning model is a supervised machine learning model.

17. The non-transitory computer-readable storage medium of claim 15, wherein the machine learning model is trained using a random forest algorithm.

18. The non-transitory computer-readable storage medium of claim 15, wherein the one or more parameters comprise at least one of: a program erase count associated with the source address, a wordline associated with the source address, a block number associated with the source address, an elapsed time since the source address was last written to, and a temperature of the memory device.

19. The non-transitory computer-readable storage medium of claim 15, wherein the processing device is to perform operations further comprising:
responsive to determining that the read verify relevance does not satisfy the threshold condition, performing a read verify operation on data stored at the source address.

20. The non-transitory computer-readable storage medium of claim 15, wherein the processing device is to perform operations further comprising:
- determining a bit error rate for a portion of the data stored at the source address;
- responsive to determining that the bit error rate is above or equal to a bit error rate threshold and that the read verify relevance satisfies the threshold condition, disabling the machine learning model;
- retraining the machine learning model using input data generated during operation of the memory device; and
- responsive to determining that the bit error rate is a predetermined amount below the bit error rate threshold and that the read verify relevance satisfies the threshold condition, enabling the machine learning model.

* * * * *